(12) United States Patent
Clarke et al.

(10) Patent No.: US 9,312,204 B2
(45) Date of Patent: Apr. 12, 2016

(54) METHODS OF FORMING PARALLEL WIRES OF DIFFERENT METAL MATERIALS THROUGH DOUBLE PATTERNING AND FILL TECHNIQUES

(71) Applicant: Intel Corporation, Santa Clara, CA (US)

(72) Inventors: James S. Clarke, Portland, OR (US); Anthony C. Schmitz, Hillsboro, OR (US); Richard E. Schenker, Portland, OR (US)

(73) Assignee: Intel Corporation, Santa clara, CA (US)

( * ) Notice: Subject to any disclaimer, the term of this patent is extended or adjusted under 35 U.S.C. 154(b) by 29 days.

(21) Appl. No.: 14/040,191

(22) Filed: Sep. 27, 2013

(65) Prior Publication Data

US 2015/0091174 A1  Apr. 2, 2015

(51) Int. Cl.
*H01L 23/48* (2006.01)
*H01L 23/52* (2006.01)
(Continued)

(52) U.S. Cl.
CPC ........ *H01L 23/481* (2013.01); *H01L 21/76816* (2013.01); *H01L 21/76834* (2013.01);
(Continued)

(58) Field of Classification Search
CPC ........... H04L 2224/73265; H04L 2224/05571; H04L 2224/13147; H04L 23/5226; H04L 21/76843; H04L 23/49827; H04L 21/76897; H04L 21/76831; H04L 2224/45147; H04L 2224/484; H04L 2224/92247; H04L 2225/06541; H04L 21/28525; H04L 21/30604; H04L 21/76802; H04L 21/76807; H04L 21/76877; H04L 2224/05022; H04L 2224/0557; H04L 23/528; H04L 23/53238; H04L 24/48; H04L 25/50; H04L 21/76813; H04L 21/76819; H04L 21/76822; H04L 21/76895; H04L 23/5227; H04L 23/53228; H04L 23/53257; H04L 23/535; H04L 24/19; H04L 27/1203; H04L 29/0642; H04L 29/0649; H04L 29/1033; H04L 29/517; H04L 29/66621; H04L 29/66628; H04L 29/66666; H04L 29/66681; H04L 29/66727; H04L 29/66734; H04L 29/7396; H04L 33/387; H04L 23/522; H04L 27/06; H04L 21/3205; H04L 23/525; H04L 29/165
USPC ......... 257/621, 774, 629, 630, 637–640, 672, 257/675, E21.597; 438/687, 635, 643, 678
See application file for complete search history.

(56) References Cited

U.S. PATENT DOCUMENTS 6,593,246 B1 * 7/2003 Hasegawa et al. ............ 438/736
2006/0289999 A1 12/2006 Lee et al.
(Continued)

FOREIGN PATENT DOCUMENTS

KR  1020070072309 A  7/2007
KR  1020090026495 A  3/2009

OTHER PUBLICATIONS van Veenhuszen, et al. "Demonstration of an electrically functional 34 nm metal pitch interconnect in ultralow-k ILD using spacer-based pitch quartering," Components Research.
(Continued)

*Primary Examiner* — Dao H Nguyen
*Assistant Examiner* — Tram H Nguyen
(74) *Attorney, Agent, or Firm* — Grossman, Tucker, Perreault & Pfleger, PLLC

(57) ABSTRACT

An integrated circuit and a method of forming an integrated circuit including a first dielectric layer including a surface, a plurality of first trenches defined in the dielectric layer surface, and a plurality of first wires, wherein each of the first wires are formed in each of the first trenches. The integrated circuit also includes a plurality of second trenches defined in the dielectric layer surface, and a plurality of second wires, wherein each of the second wires are formed in each of the second trenches. Further, the first wires comprise a first material having a first bulk resistivity and the second wires comprise a second material having a second bulk resistivity, wherein the first bulk resistivity and the second bulk resistivity are different.

26 Claims, 16 Drawing Sheets

(51) Int. Cl.
*H01L 29/40* (2006.01)
*H01L 21/768* (2006.01)
*H01L 23/532* (2006.01)

(52) U.S. Cl.
CPC .... *H01L21/76838* (2013.01); *H01L 21/76879* (2013.01); *H01L 21/76897* (2013.01); *H01L 21/76883* (2013.01); *H01L 23/53228* (2013.01); *H01L 23/53242* (2013.01); *H01L 23/53257* (2013.01); *H01L 2924/0002* (2013.01)

(56) References Cited

U.S. PATENT DOCUMENTS

| | | | |
|---|---|---|---|
| 2007/0052101 A1* | 3/2007 | Usami | 257/758 |
| 2008/0087966 A1* | 4/2008 | Tai et al. | 257/369 |
| 2008/0174017 A1* | 7/2008 | Yang et al. | 257/751 |
| 2009/0057905 A1 | 3/2009 | Keum | |
| 2009/0325384 A1 | 12/2009 | Yamada | |
| 2011/0204525 A1* | 8/2011 | Seo | 257/774 |
| 2011/0266679 A1* | 11/2011 | Hotta et al. | 257/758 |
| 2013/0113101 A1* | 5/2013 | Cheng et al. | 257/751 |
| 2014/0203448 A1* | 7/2014 | Song et al. | 257/774 |
| 2014/0264432 A1* | 9/2014 | Cotorogea et al. | 257/139 |

OTHER PUBLICATIONS

Chawla, et al., "Demonstration of a 12 nm-Half-Pitch Copper Ultralow-k Interconnect Process", Components Research.
International Search Report and Written Opinion received for Application No. PCT/US2014/057359, mailed on Jan. 7, 2015, 13 pages.

* cited by examiner

METHODS OF FORMING PARALLEL WIRES OF DIFFERENT METAL MATERIALS THROUGH DOUBLE PATTERNING AND FILL TECHNIQUES

FIELD OF INVENTION

The present disclosure relates to methods of forming parallel wires of different metal materials through double patterning and fill techniques.

BACKGROUND

As integrated circuit features are scaled down, particularly with critical dimensions below 50 nm, and power density increases, electromigration becomes relatively more prominent. Electromigration is understood as the transport of material due to movement of ions in a conductor. Electromigration may result in the formation of hillocks or voids in the interconnects and may eventually lead to a reduction in reliability or failure of the circuit. To reduce electromigration, and other stress induced failures, refractory metals continue to be explored for use in interconnect fabrication. However, refractory metals exhibit increased bulk resistivity, which negatively influences observed resistance.

In addition, as feature size drops, interconnect delay may exceed gate delay and form a relatively large portion of total device delay. Interconnect delay is understood to be caused, at least in part, by resistive-capacitance delay. Resistive-capacitance delay, or RC delay, is understood as the delay of signal propagation as a function of resistance, which again is in part dependent on the bulk resistivity of the metal wire composition, and as a function of insulator capacitance, which is in part dependent on the permittivity of the interlayer dielectric. Materials exhibiting relatively lower resistivity in bulk are generally more prone to electromigration.

Therefore, as feature size continues to decrease, room remains for improvement in the design of interconnects with, in some instances, an emphasis on interconnect delay and resistance to various stresses, such as those resulting in electromigration and thermomechanical failures.

BRIEF DESCRIPTION OF THE DRAWINGS

The above-mentioned and other features of this disclosure, and the manner of attaining them, may become more apparent and better understood by reference to the following description of embodiments described herein taken in conjunction with the accompanying drawings, wherein:

FIGS. 4a through 4h illustrate an embodiment of wire formation in the dielectric layer according to the method shown in FIG. 3, wherein FIG. 4a illustrates a patterned resist for the formation of trenches in a first dielectric layer; FIG. 4b illustrates a first set of trenches formed in the dielectric layer; FIG. 4c illustrates a first wire material deposited in the first set of trenches and overburden; FIG. 4d illustrates the first set of wires after planarizing the overburden; FIG. 4e illustrates a patterned resist for the second set of trenches; FIG. 4f illustrates a second set of trenches formed in the dielectric layer for a second set of wires; FIG. 4g illustrates the second wire material deposited in the second set of trenches including overburden; FIG. 4h illustrates the dielectric layer with a second set of wires after removal of overburden as well as the first set of wires;

FIGS. 6a through 6k illustrate an embodiment of wire formation in the dielectric layer according to the method shown in FIG. 5, wherein FIG. 6a illustrates a patterned resist; FIG. 6b illustrates a first spacer layer formed over the patterned resist; FIG. 6c illustrates a portion of the spacer layer removed to form spacers on either side of the patterned resist; FIG. 6d illustrates a first set of spacers after the patterned resist is removed; FIG. 6e illustrates backbones formed from a sacrificial hardmask; FIG. 6f illustrates a second spacer layer; FIG. 6g illustrates a second set of spacers; FIG. 6h illustrates trenches formed in a first layer of dielectric; FIG. 6i illustrates a first wire material deposited in the dielectric layer; FIG. 6j illustrates the formation of a second set of trenches after the removal of overburden of the first wire material, forming the first set of wires, the removal of the backbones, and etching of the dielectric layer; and FIG. 6k illustrates a second set of wires formed in the second set of trenches after the deposition of the second material and removal of overburden of the second material;

FIGS. 8a through 8h illustrate an embodiment of wire and hardmask formation according to the method illustrated in FIG. 7, wherein FIG. 8a illustrates a first set of trenches formed in a first hardmask and first dielectric layer; FIG. 8b illustrates a first set of wires formed in the first set of trenches; FIG. 8c illustrates recesses formed in the trenches above the wires; FIG. 8d illustrates a second hardmask deposited in the recesses over the first set of wires; FIG. 8e illustrates a second set of trenches formed in the first hardmask and first dielectric layer; FIG. 8f illustrates a second set of wires formed in the second set of trenches; FIG. 8g illustrates a second set of recesses formed in the second set of trenches above the second set of wires; FIG. 8h illustrates a third hardmask formed over the second set of wires in the second set of recesses;

FIGS. 9a through 9e illustrates an embodiment of via formation according to the method illustrated in FIG. 7, wherein FIG. 9a illustrates a second dielectric layer deposited over the first, second and third hardmask; FIG. 9b illustrates an opening formed in the second dielectric layer and an opening formed in the second hardmask; FIG. 9c illustrates a via formed in the openings formed in the second dielectric layer and second hardmask; FIG. 9d illustrates an opening formed in the second dielectric layer and an opening formed in the third hardmask; and FIG. 9e illustrates a via formed in the opening in the second dielectric layer and third hardmask.

DETAILED DESCRIPTION

The present disclosure relates to methods of forming parallel wires of different metal materials in a dielectric layer through double patterning and fill techniques and devices formed by such methods. The methods are applicable to devices that exhibit node sizes of 50 nm or less, such as in the range of 5 nm to 50 nm, including 5 nm to 20 nm, 12 nm, 8 nm, etc. However, the methods may be applied to devices having larger node sizes as well. In particular, the present disclosure provides for an interlayer dielectric including at least one dielectric layer having a surface. Wires of different materials are formed in the surface of a dielectric layer. In providing multiple materials for wires in an interlayer dielectric, wire material properties can be selected based on factors such as the amount of power the wire is intended to carry and the desired speed at which a signal can be transferred by a wire. Therefore, in providing dielectric layers including wires formed of different materials as disclosed herein, wire material may be selected based on a desired function of the wire. For example, power carrying wires are formed of materials exhibiting relatively low electromigration, whereas signal carrying wires are formed of materials exhibiting relatively low resistivity.

Again, electromigration is understood as the transport of material due to movement of ions in the wire. Electromigration may result in the formation of hillocks or voids in the interconnects and may eventually lead to a reduction in reliability or failure of the circuit. To reduce electromigration, and other stress induced failures, refractory metals continue to be explored for use in interconnect fabrication. However, refractory metals exhibit increased bulk resistivity, which negatively influences observed resistance, increasing resistive-capacitance (RC) delay. Resistive-capacitance delay, or RC delay, is understood as the delay of signal propagation as a function of 1) resistance, which again is in part dependent on the resistivity of the metal wire composition, and 2) insulator capacitance, which is in part dependent on the permittivity of the interlayer dielectric. Thus, materials that exhibit relatively lower electromigration may not be suited for signal carrying connections due to interconnect delay. And, vice versa, materials that exhibit relatively lower bulk resistivity tend to be relatively more prone to electromigration.

Figure 1:
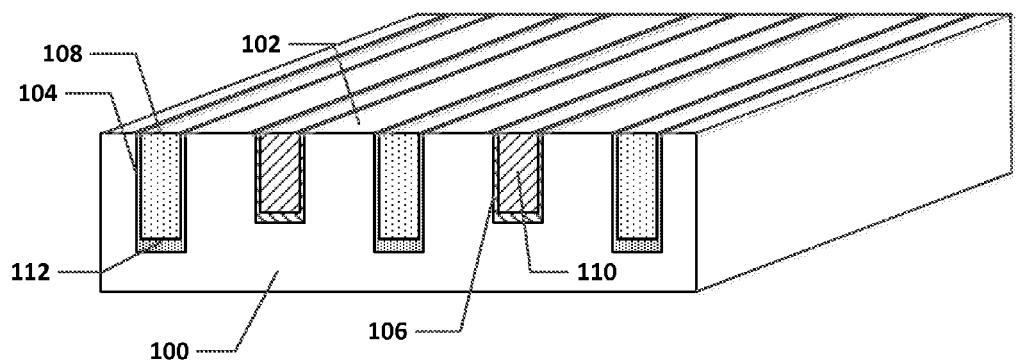
FIG. 1 illustrates a top, cross-sectional perspective view of an embodiment of a dielectric layer including a plurality of wires formed from different materials, wherein the wires of a first material run parallel to wires of a second material.

FIG. 1 illustrates an embodiment of a dielectric layer 100 having a surface 102 in which is defined a number of trenches including first trenches 104 and second trenches 106, which may form, for example, a metallization layer. Wires are provided in the trenches. The first set of trenches 104 includes wires of a first material 108 and the second set of trenches 106 include wires of a second material 110. While wires formed of two materials are illustrated, wires of more than two materials may be formed, such as three materials or four materials. Optionally, a diffusion barrier, adhesion layer, or both (represented by 112) are deposited within the trenches 104, 106 prior to depositing the wires 108, 110 depending on, for example, the selection of the wire material and the dielectric layer 100 material.

Figure 2:
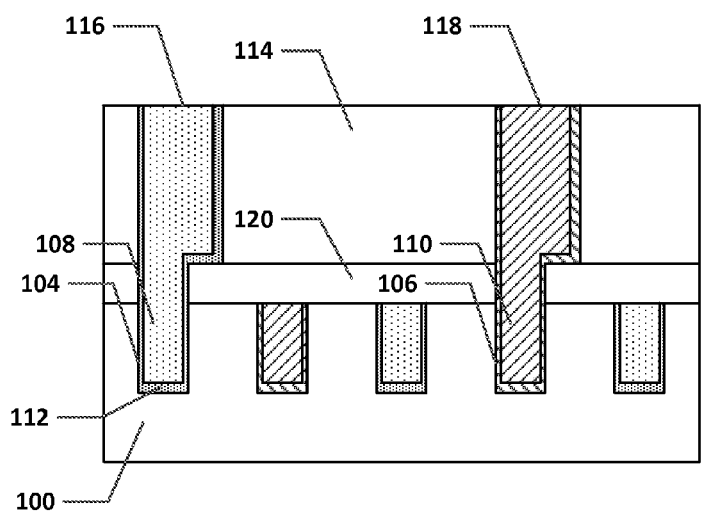
FIG. 2 illustrates a cross-sectional view of an embodiment of a first dielectric layer including a plurality of wires formed from different materials and a second dielectric layer including a via for connecting the one of the wires of a first material and a via for connecting one of the wires of a second material.

In further embodiments, such as illustrated in FIG. 2, additional dielectric layers, such as a second dielectric layer 114 are disposed over the first dielectric layer 100. Vias 116, 118 are formed in the second dielectric layer. In embodiments, the vias are formed of materials exhibiting similar bulk resistivity, electromigration characteristics, or both, as the materials of the wires that the vias contact. In examples, the vias are formed of the same material as the material of the wire to which is contacts. In such examples, via 116 is formed of the same material as wire 108 and via 118 is formed of the same material as wire 110. A hardmask layer 120, including one or more hardmask materials is present between the first dielectric layer 100 and the second dielectric layer 114. Furthermore, in examples, a diffusion barrier, adhesion layer or both (again represented by 112) is present on the walls of the via openings.

One or more dielectric layers 100, 114 include a dielectric material. A dielectric material is understood to be a material that is an insulator but is polarized upon application of an electric field. In embodiments, the dielectric includes a low-k dielectric, that is, a material with a dielectric constant that is lower than 3.9, i.e., the dielectric constant of silicon dioxide, including all values and ranges from 1.5 to 3.8, such as 1.7, 1.9, 2.1, 2.8, 2.7, etc. Non-limiting examples from which the dielectric material may be selected include fluorine-doped silicon dioxide, carbon doped oxide (i.e., carbon-doped silicon dioxide), organo silicate glass, silicon oxycarbide, hydrogenated silicon oxycarbide, porous silicon dioxide, and organic polymer dielectrics such as polyimide, polytetrafluoroethylene, polynorbornenes, benzocyclobutene, hydrogen silsequioxane and methylsilsesquioxane. Each dielectric layer material is individually selected from the above. In examples, the dielectric layers are formed from the same material or different materials. Further, in embodiments, each dielectric layer has a thickness in the range of 50 nm to 300 nm, including all values and ranges therein, such as 100 nm to 300 nm, 100 nm to 200 nm, etc.

In embodiments, the first wires and the second wires exhibit a different bulk resistivity. In embodiments, the first bulk resistivity is greater than the second bulk resistivity. For example, the first wires, i.e., wires of the first material, exhibits a first bulk resistivity, $\rho 1$, of $5.0\,\mu\Omega\cdot cm$ or greater at 20° C., including all values and ranges from $5.0\,\mu\Omega\cdot cm$ to $8.0\,\mu\Omega\cdot cm$, such as $5.5\,\mu\Omega\cdot cm$, $5.6\,\mu\Omega\cdot cm$, $6.0\,\mu\Omega\cdot cm$, $7.1\,\mu\Omega\cdot cm$. The first wire material includes, for example, tungsten, cobalt, ruthenium, molybdenum or alloys including one or more of these elements. In some examples, the alloys include one of the above with copper or aluminum. In particular embodiments, the first wires do not include copper. The second wires, i.e., wires of the second material, exhibit a second bulk resistivity, $\rho 2$, of $4.0\,\mu\Omega\cdot cm$, or less at 20° C., including all values and ranges from $1.0\,\mu\Omega\cdot cm$ to $4.0\,\mu\Omega\cdot cm$, such as 1.7, 2.7, etc. The second wire material includes, for example, copper, aluminum, gold, silver or alloys including one or more of these elements. As understood by a person of ordinary skill in the art, the actual resistivity exhibited by each material being dictated, in part, by wire geometry.

While the wire geometry is illustrated as being generally square or rectangular and having relatively sharp corners, the wire geometry may be circular, elliptical or exhibit rounded corners of varying radii. In addition, referring again to FIG. 1, the height of the wires may be varied as between the materials, wherein the wires of the first material exhibit a different height than the wires of the second material. This variance in geometry may allow the conductive wire area to be tailored for higher resistivity materials to provide an overall lower resistance of the wire. In one example, as illustrated, the wires of the first material 108 have a greater height than the wires of the second material 110. However, in embodiments, the wires of the second material may be greater than that of the first material.

Figure 3:
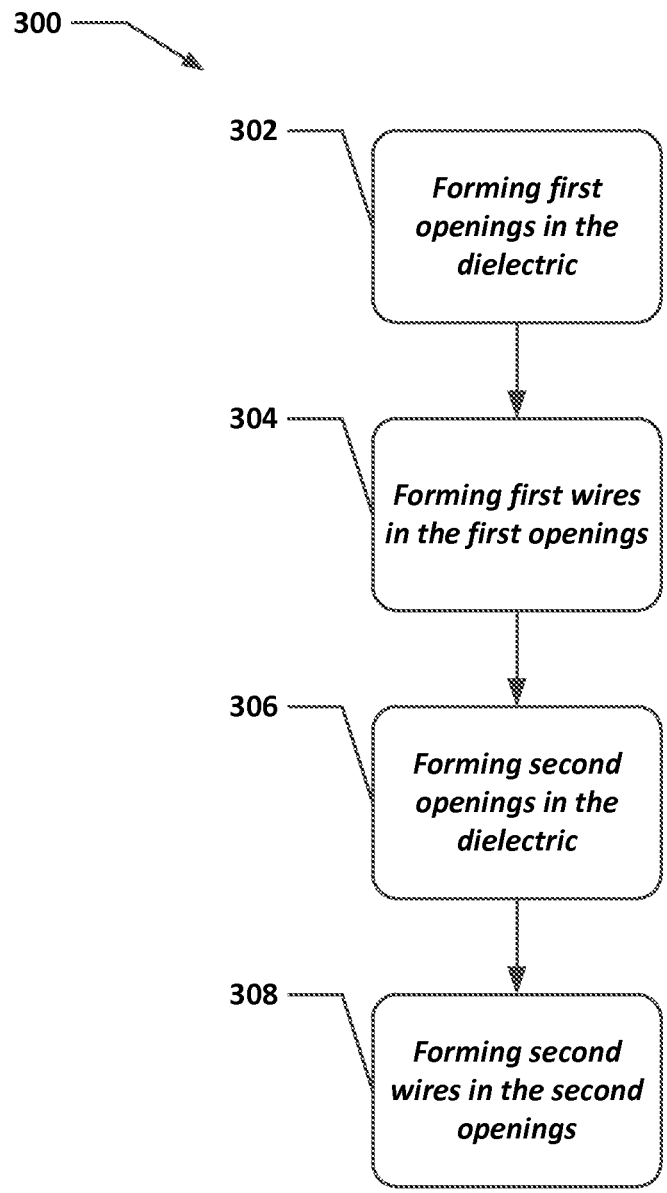
FIG. 3 illustrates a flow chart of an embodiment of a method of forming wires of a first and second material in a dielectric layer using lithography.

FIG. 3 illustrates an embodiment of a method 300 of forming the wires of a first and second material in a dielectric layer and in particular embodiments, form a metallization layer. The method includes forming a first set of trenches in a surface of a dielectric material 302. In one embodiment, the trenches are formed using lithography through a litho-etch litho-etch scheme. In another embodiment, the trenches are formed using spacer-based pitch division. In further embodiments, both methods may be used to form the trenches in the dielectric layer. After forming the first trenches, a wire is formed within each trench with the first material 304. In embodiments, the wires are formed using vapor deposition processes, such as chemical vapor deposition or physical vapor deposition, including magnetron sputtering.

Then a second set of trenches is formed 306 in the dielectric layer surface. The second set of trenches is again formed in the dielectric layer using lithography, spacer-based pitch division or combinations thereof. After forming the second set of trenches, a wire is formed within each trench with the second material 306. The wires are formed using electrodeposition processes, vapor deposition processes, or a combination thereof such as in the case of copper, wherein physical vapor deposition is used to form a seed layer, which is followed by electrodeposition.

Figure 4A:
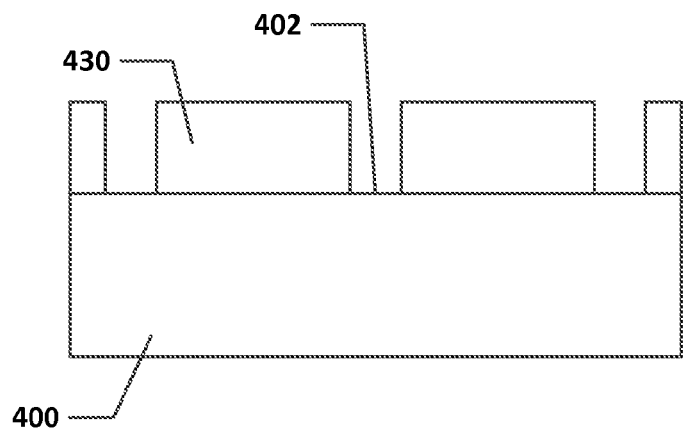
Figure 4B:
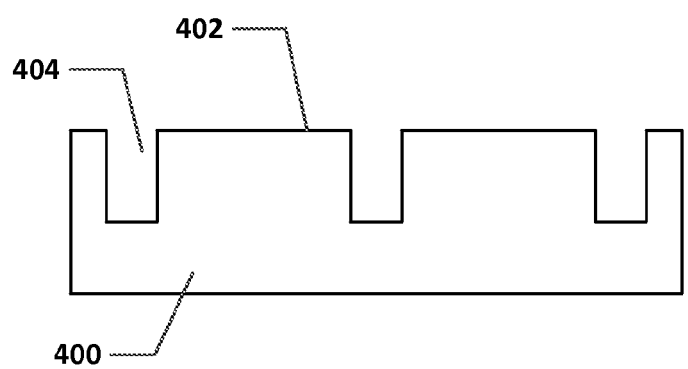

Expanding on the above, in embodiments, the first set of trenches is formed using lithography and, in particular, optical lithography as well as e-beam or extreme ultraviolet lithography. In lithography, a resist material is cast onto the dielectric layer surface using a casting process such as spin coating. The resist material includes, for example, an optically sensitive polymer. Using a mask, a pattern is projected onto the resist using light having a wavelength in the range of 157 nm to 436 nm, including all values and ranges therein, such as for example, 193 nm. The resist is developed and, as illustrated in FIG. 4a, a portion of the resist 430, based upon the projected pattern, is removed exposing a portion of the surface 402 of the dielectric layer 400. The exposed surfaces of the dielectric layer are then etched, forming trenches 404 in the surface 402, and the remainder of the resist is removed as illustrated in FIG. 4b, such as by an ashing process. Etching is understood as the removal of a material by physical or chemical removal processes. An example of a physical removal process includes ion bombardment and an example of a chemical process includes oxidation-reduction reactions. Ashing is understood as a process for the removal of a resist, such as by plasma ashing using oxygen or fluorine plasmas.

Figure 4C:
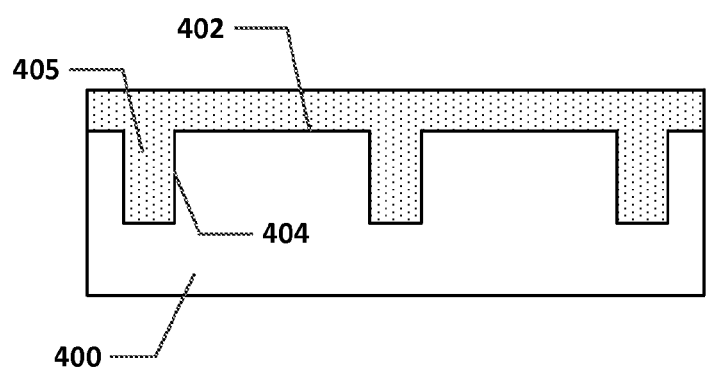
Figure 4D:
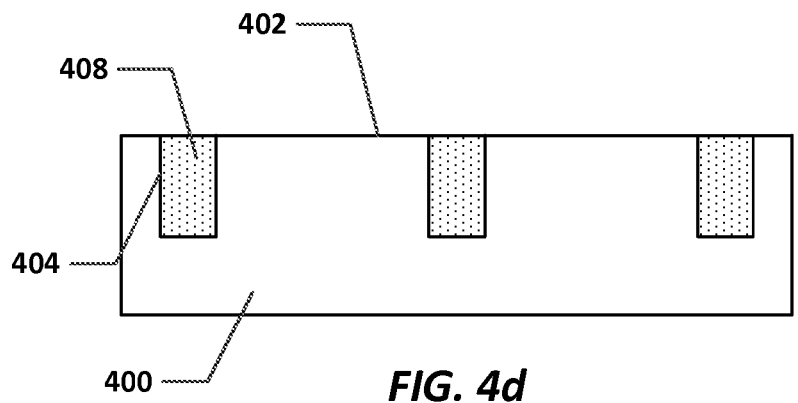

The first material 405 is then deposited over the surfaces 402 of the dielectric layer 400 and into the first set of trenches 404 as illustrated in FIG. 4c. The first material 405 is deposited using deposition processes including chemical vapor deposition (including atomic layer deposition) or physical vapor deposition such as magnetron sputtering. Overburden of the first material 405, i.e., the amount of first material present over or on top of the surface 402 of the dielectric layer 400, is them removed by chemical mechanical planarization, or other planarization processes, or a chemical removal process such as oxidation. As illustrated in FIG. 4d, removing the overburden to expose the dielectric layer separates the deposited first material into wires 408.

Optionally, a diffusion barrier, adhesion layer or both, (see 112 of FIG. 1) are deposited onto the surfaces of the trenches 404 before the first wire material is deposited into the trenches. Selection of diffusion barrier, adhesion layers or both is based upon, for example, the selection of wire material and the material the dielectric layer is formed from. In examples, these layers are deposited using vapor deposition (chemical or physical) or by atomic layer deposition processes.

Figure 4E:
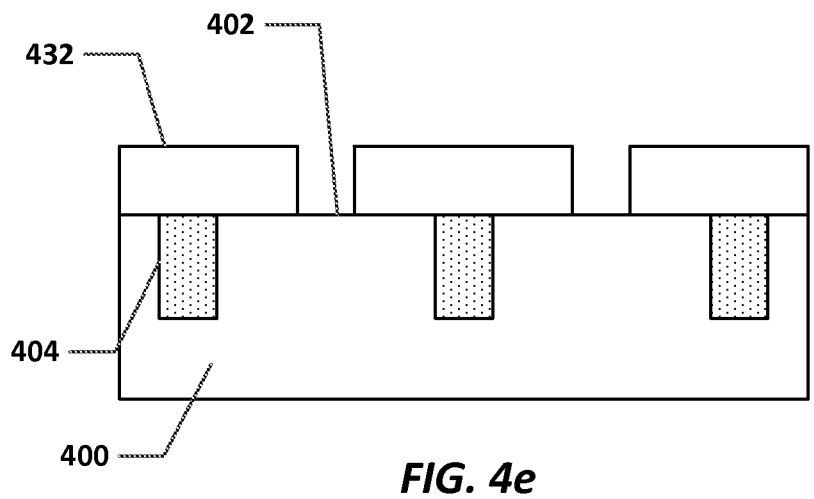
Figure 4F:
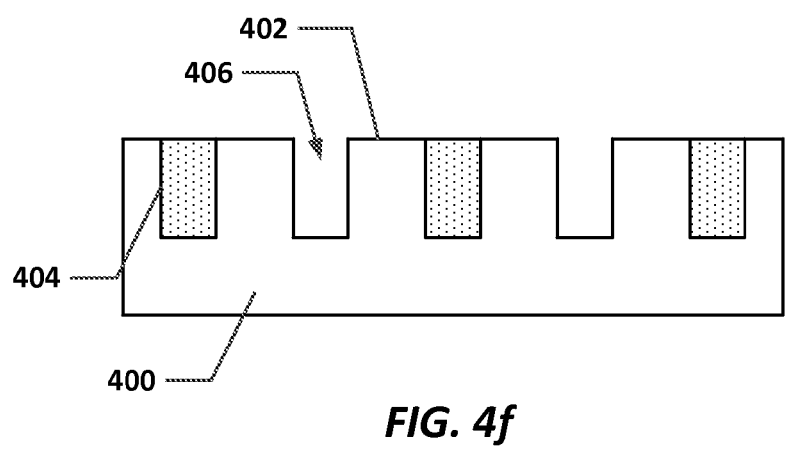

After forming the first set of wires, the second set of wires is formed. Again, using lithography, a resist material is cast onto a dielectric material again using a casting process such as spin coating. The resist material includes, for example, an optically sensitive polymer. The resist may be the same or different than that used to form the first set of trenches. Using a mask, a pattern is projected onto the resist using light having a wavelength in the range of 157 nm to 436 nm, including all values and ranges therein, such as for example, 193 nm. In other embodiments, extreme ultraviolet radiation or x-rays are used to pattern. The resist is developed and, as illustrated in FIG. 4e, a portion of the resist 432, based upon the projected pattern, is removed again exposing a portion of the surface 402 of the dielectric layer 400. The exposed surfaces 402 of the dielectric layer 400 are then etched, forming a second set of trenches 406 for the second wire material in the surface 402, and the remainder of the resist is removed as illustrated in FIG. 4f, such as by an ashing process.

Figure 4G:
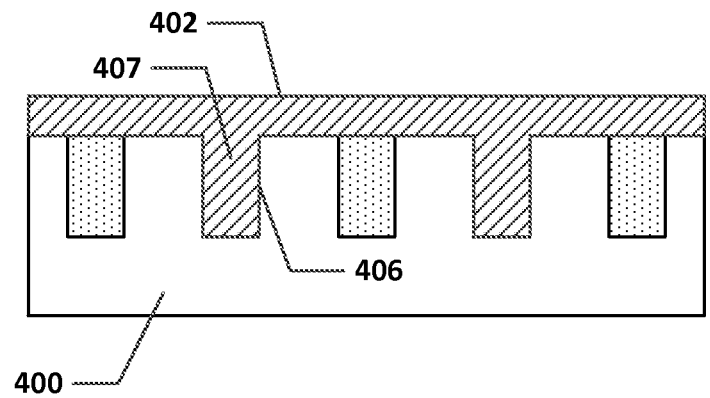
Figure 4H:
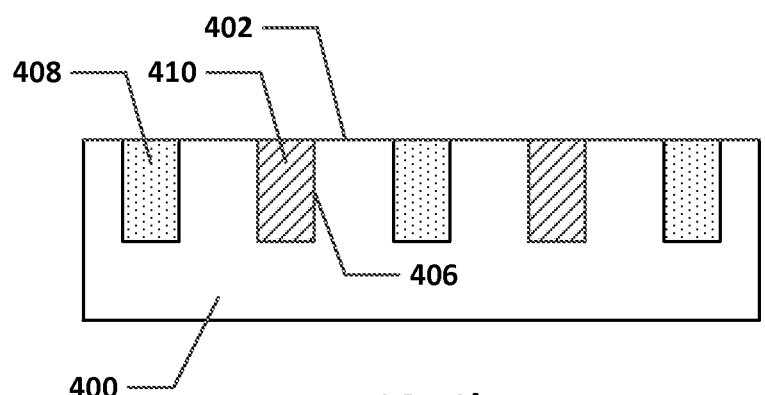

The second material 407 is then deposited over the surfaces 402 of the dielectric layer 400 and into the second trenches 406 as illustrated in FIG. 4g. The second material 407 is deposited using deposition processes including chemical vapor deposition or physical vapor deposition such as magnetron sputtering. In further embodiments, where the second material is copper, the copper is deposited using physical vapor deposition to form a seed layer in the trenches, and then the remainder of the trenches are filled with copper deposited by electroplating. Overburden of the second material 407 is removed by chemical mechanical planarization. As illustrated in FIG. 4h, removing the overburden provides a dielectric layer 400 including one or more second trenches 406 including a wire 410 of a second material formed within each of the trenches 406. This second set of wires 410 being in addition to the first wires 408 also formed in the dielectric layer 400 with both the first set and second set of wires being formed in the same surface 402 of the dielectric layer 400.

As noted above, in another embodiment, spacer based pitch division is used to form the wires of different material within the openings. A brief summary of spacer based pitch division is described herein with reference to FIG. 5 and illustrated in FIGS. 6a through 6g.

Figure 5:
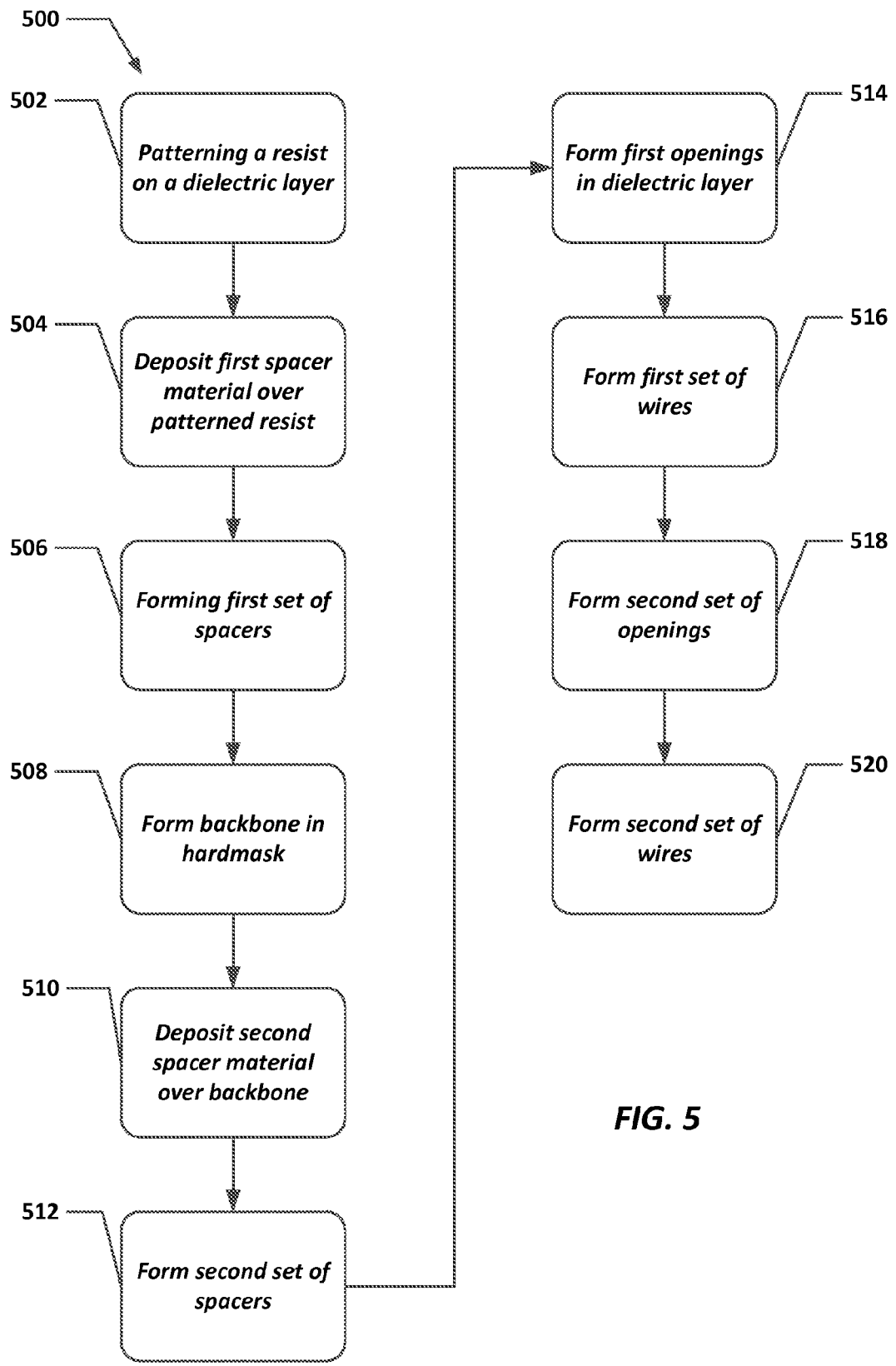
FIG. 5 illustrates a flow chart of an embodiment of a method of forming wires of a first and second material in a dielectric layer using spacer based pitch division.

FIG. 5 is a flow chart of an embodiment of a method of spacer based pitch division. The dielectric layer includes, for example, a dielectric barrier disposed over the dielectric layer, a sacrificial hardmask disposed over the dielectric barrier, and, optionally, an anti-reflective coating disposed over the sacrificial hardmask, which is further described with reference to FIG. 6a. In embodiments, the process begins with patterning a resist cast onto a dielectric layer 502. A first spacer layer is then deposited in a conformal layer over the patterned resist and dielectric surface 504. Then the spacer layer is etched anisotropically, leaving the spacer walls, and the resist is removed, forming a first set of spacers 506.

The second set of spacers is formed by anisotropically etching into the sacrificial hardmask, removing the anti-reflective coating, and forming a backbone for the second spacer layer in the sacrificial hardmask 508. A second spacer layer is then deposited over the backbone formed in the sacrificial hardmask 510. The second spacer layer is then anisotropically etched 512. The dielectric barrier and dielectric are etched, forming trenches in the dielectric layer 514. In embodiments, the first wire material is then deposited into the trenches formed in the dielectric layer and the surface is polished to expose the backbones and form the first set of wires 516. The backbones are then removed 516 and the dielectric layer is etched again forming a second set of trenches 518. Then the second wire material is deposited in the second set of trenches and the surface polished to remove any overburden and exposing the first set of wires and forming the second set of wires 520.

Figure 6A:
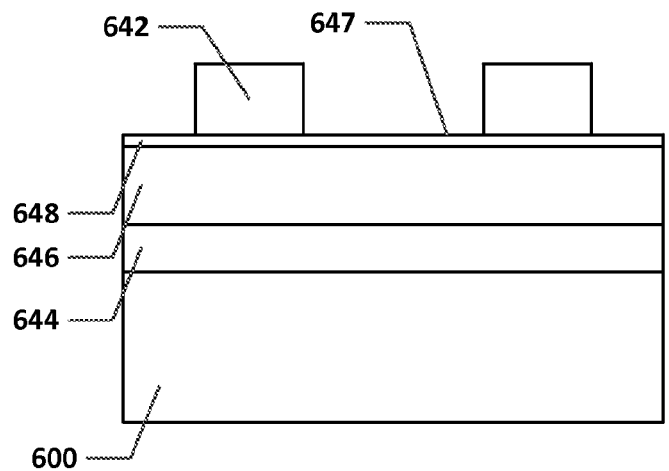

Expanding on the above, beginning with FIG. 6a, a dielectric layer 600 is provided including a dielectric barrier 644 disposed on top of the dielectric layer 600 and a sacrificial hardmask 646 disposed over the dielectric barrier 644. In addition, an optional anti-reflective coating 648 is disposed over the sacrificial hardmask 646. The hardmasks and anti-reflective coatings are applied, for example, by spin coating. Alternatively, other deposition processes can be used as well.

A layer of resist is deposited over the hardmasks 644, 646 and optional anti-reflective coating by casting. The resist is patterned by lithography. In particular embodiments, optical lithography is used, wherein a pattern is projected onto the resist layer 642 using light having a wavelength in the range of 157 nm to 436 nm, including all values and ranges therein, such as for example, 193 nm. The resist 642 is developed and a portion of the resist is removed, exposing a portion of the upper surface of the dielectric layer (defined by the upper surface 647 of the anti-reflective coating 648 or hardmask 646, depending on which is present as the upper layer underneath the resist).

Figure 6B:
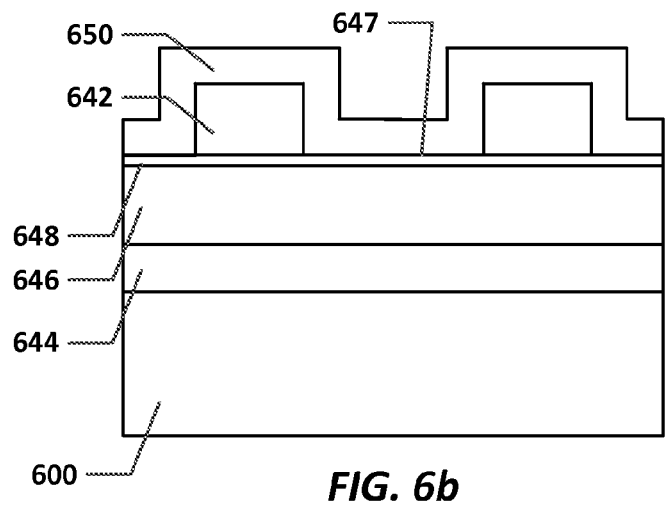
Figure 6C:
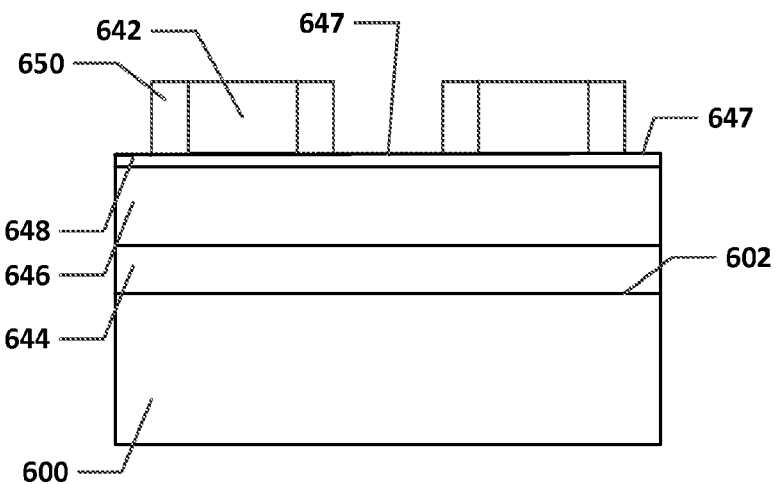
Figure 6D:
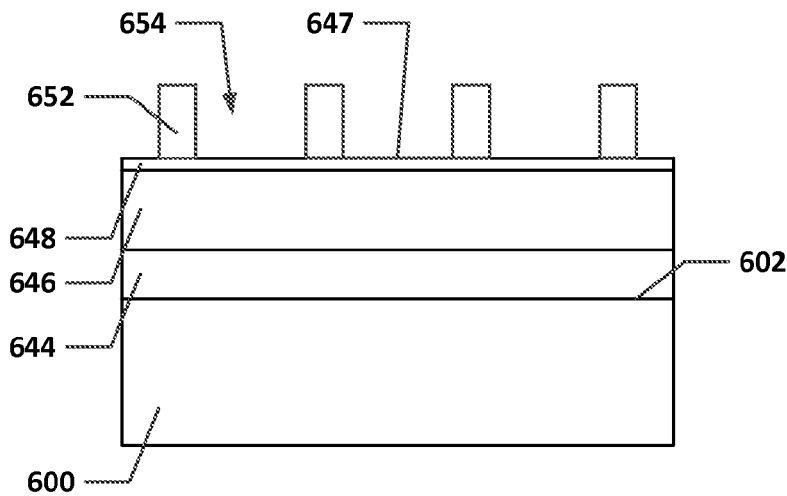
Figure 6E:
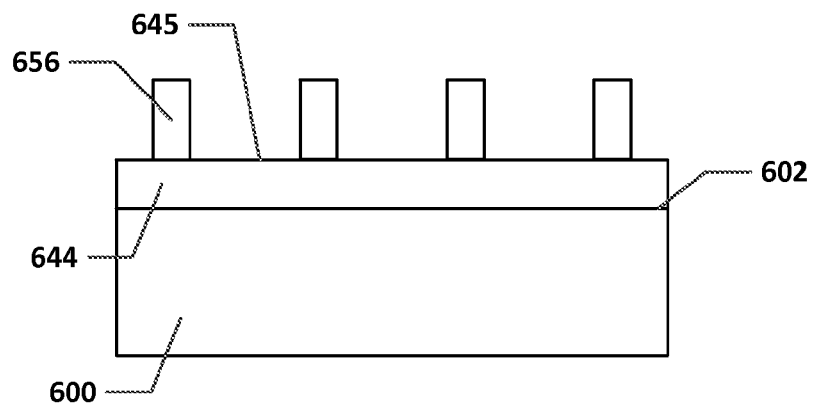

A layer of a first spacer material 650 is deposited over the surfaces of the patterned resist 642 and the anti-reflective coating surface 647 as illustrated in FIG. 6b. In embodiments, the layer of spacer material is a conformal coating, which is understood as a coating that conforms to the exposed surfaces (including the side walls and upper surface of the resist and the exposed surfaces 647 of the antireflective coating) and exhibits a consistent thickness over all such surfaces, wherein the thickness appears constant to subsequent processing steps. In embodiments, the variation of the coating thickness is +/−20% of the average coating thickness. The spacer layer is then anisotropically etched, removing portions of the spacer layer that are generally parallel to the upper surface 603 of the dielectric layer 600 as illustrated in FIG. 6c. The remainder of the resist 642 is also removed such as by ashing. This forms a first set of spacers 652 with openings 654 therebetween as illustrated in FIG. 6d. The upper surface 647 is again anisotropically etched, removing the spacers 652, antireflective coating 648 and portions of the sacrificial hardmask 646 between the spacers that are generally parallel to the upper surface 602 of the dielectric layer. As illustrated in FIG. 6e, this forms a series of backbones 656 from the sacrificial hardmask 656 on the surface 645 of the dielectric barrier 644.

Figure 6F:
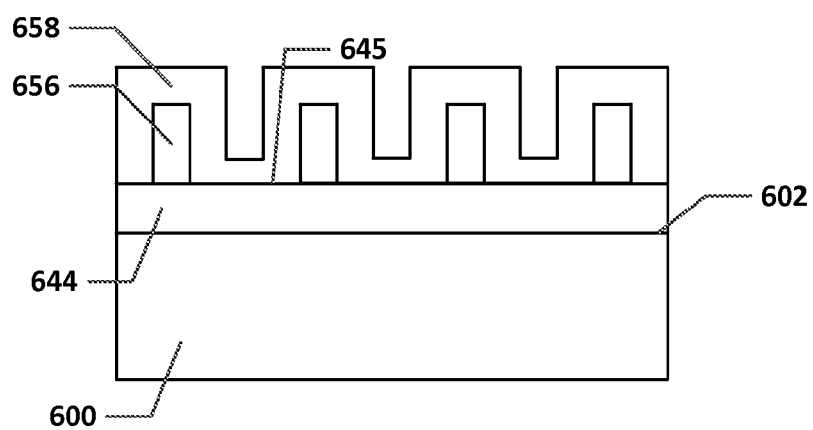
Figure 6G:
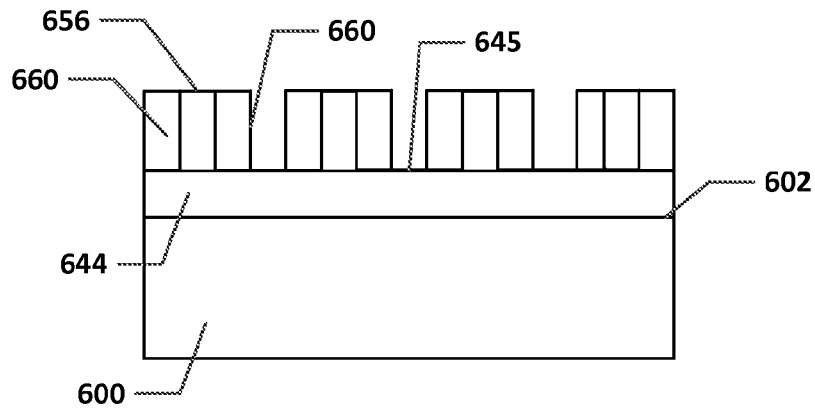
Figure 6H:
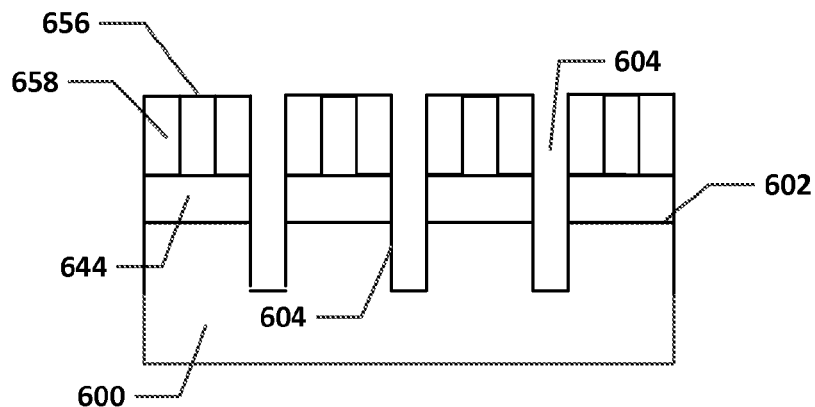

A second layer of spacer material 658 is deposited over the backbone 656 and the upper surface of the dielectric, which is now defined by the upper surface 645 of the dielectric barrier 644 as illustrated in FIG. 6f. Again, the second layer of spacer material 658 is, in embodiments, a conformal coating. In examples, the first and second layers of spacer material is formed from the same or different materials. The spacer layer 658 is then anisotropically etched, removing portions of the spacer layer 658 that are generally parallel to the upper surface 602 of the dielectric layer 600. This forms a second set of spacers 660 as illustrated in FIG. 6g with the backbones 656 formed from the sacrificial hardmask located between alternating spacers 660. The upper surface 645 of the dielectric barrier 644 and dielectric is anisotropically etched forming the first set of trenches 604 as illustrated in FIG. 6h.

Figure 6I:
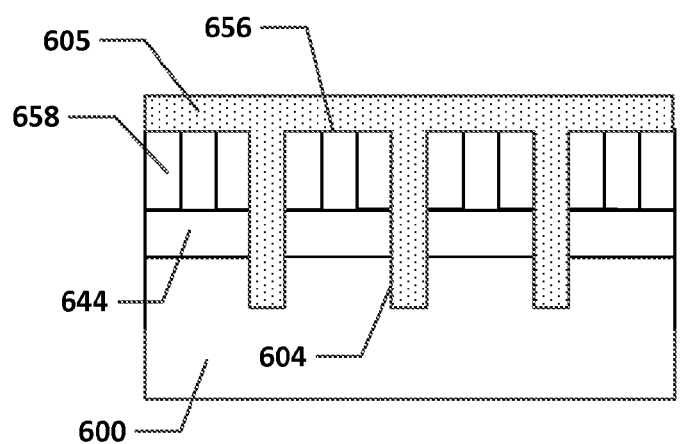
Figure 6J:
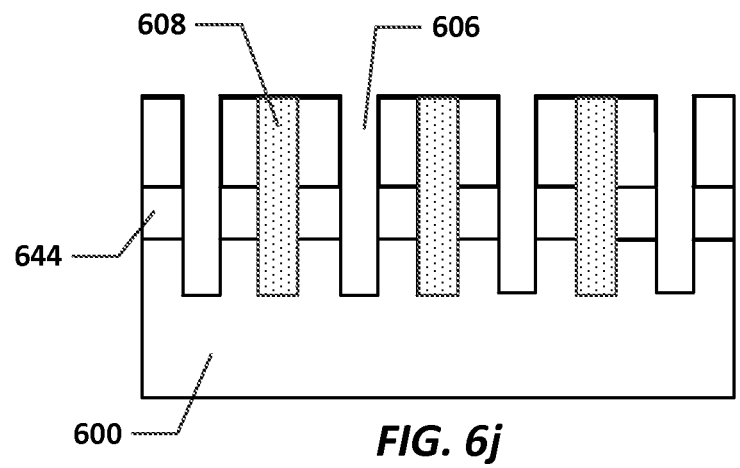
Figure 6K:
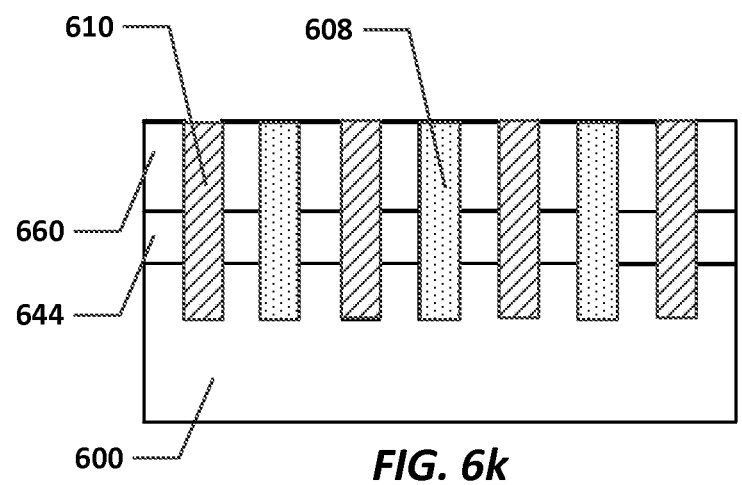

Then the first wire material 605 is deposited into the first set of trenches 604 as illustrated in FIG. 6i. The overburden is removed, such as through chemical mechanical planarization, exposing the backbones 656 and forming the first set of wires 608. The backbones 656 are also removed, such as through ashing. The dielectric barrier 644 and dielectric layer 600 are then etched forming a second set of trenches 606 in the dielectric barrier 644 and the dielectric layer 600 as illustrated in FIG. 6j. These trenches are then filled with the second wire material and the overburden is removed forming the second set of wires 610 as illustrated in FIG. 6k. Thus a first set of wires 608 of a first material and a second set of wires 610 of a second material are formed in the same surface of the dielectric layer.

Figure 7:
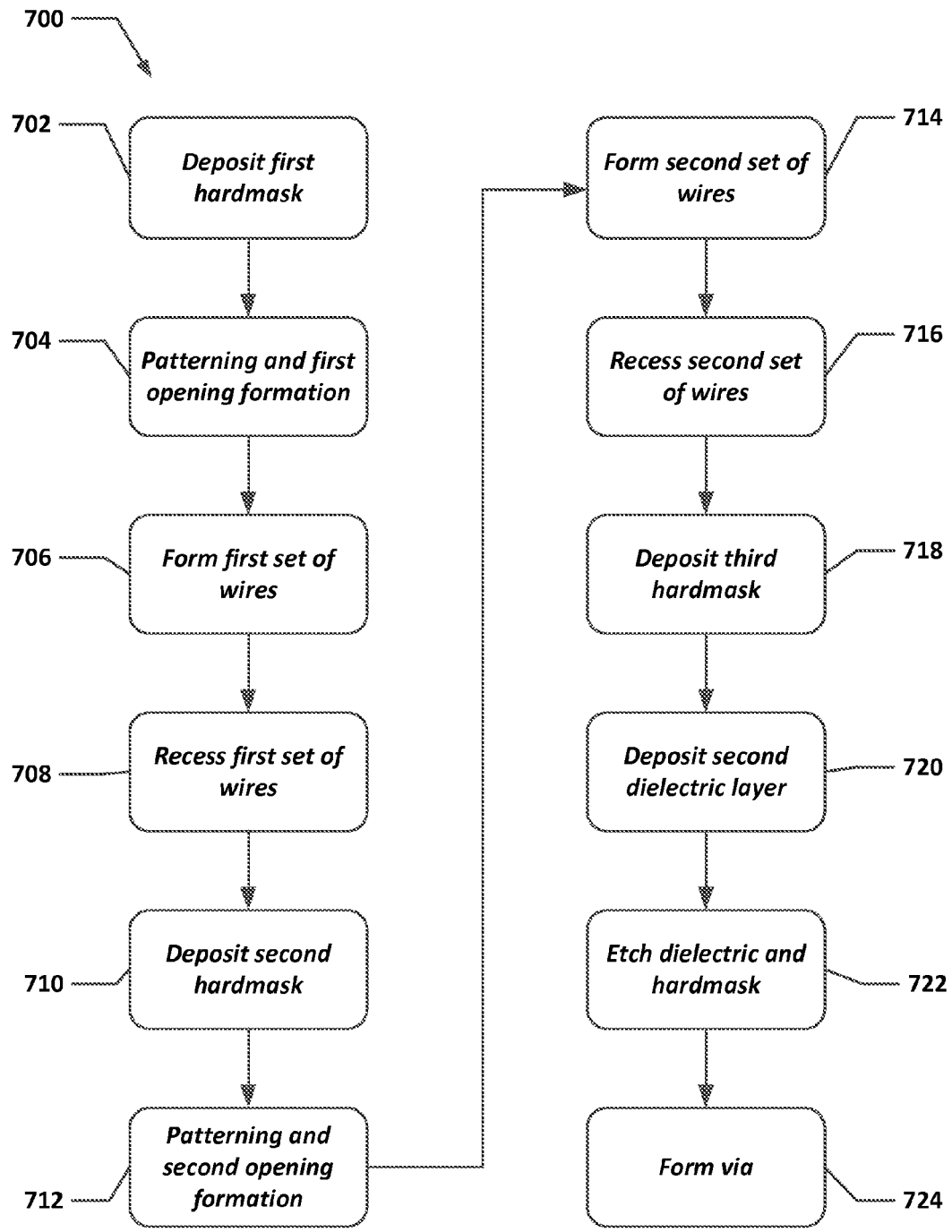
FIG. 7 illustrates a method of an embodiment of forming vias in a second dielectric layer for connecting wires in a first dielectric layer.

In further embodiments, as discussed above with reference to FIG. 2, vias are formed in an additional dielectric layer provided over the dielectric layer the wires are provided in. The vias provide electrical connectivity to the wires for either (or both) power and communication. Vias are understood as vertical electrical connections that are formed through the dielectric layers. An embodiment of a method of forming the vias is further described with respect to FIG. 7. The method begins with depositing a hardmask via chemical vapor deposition or by casting (suc as spin-on techniques) on a first dielectric layer 702. The hardmask and dielectric are then patterned and etched 704, using the patterning and etching processes described above forming a first set of trenches in the dielectric layer and hardmask. A first set of wires is then formed 706 by depositing the first wire material into the first set of openings utilizing the deposition processes described above. Any overburden is planarized or otherwise removed. The wires are then recessed below the surface of the hardmask 708 by oxidative removal or other plasma or chemical etching process that selectively removes the wire material. In particular embodiments, the wires are level with the dielectric layer surface. Then a second hardmask is deposited into the first wire recesses 710 forming discrete regions of the hardmask over the exposed first wire, i.e., the surface of the wire.

The second wires are formed by patterning and forming a second set of trenches in the dielectric layer 712. The second wire material is then deposited into the trenches using the deposition processes described above forming the second set of wires in the second set of trenches 714. Again, any overburden is planarized or otherwise removed. The second set of wires is then recessed from the surface of the hardmask 716 again through etching of the metal. In particular embodiments, the second set of wires are level with the dielectric layer surface after recessing. A third hardmask is then deposited in the recesses of the second set of wires 718. Again discrete regions of the third hardmask are formed over the exposure wire surfaces. This results in a hardmask layer that includes a first hardmask with regions of a second and third hardmask defined therein.

A second dielectric layer is then formed over the first dielectric layer and hardmask layer 720. A via opening is formed by patterning and etching an opening into the second dielectric layer and then selectively etching either the second or third hardmask, depending on which wire the via is to connect with 722. The via material is then deposited into the via opening forming the via 724.

Figure 8A:
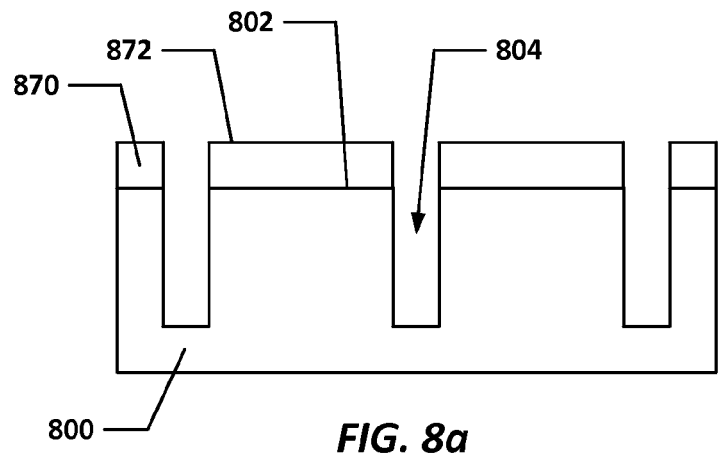

Expanding on the above, in one embodiment, illustrated in FIG. 8a, a dielectric layer 800 and first hardmask 870 deposited over the dielectric layer 800 are etched to form a first set of trenches 804 in the dielectric layer surface 802 and hardmask 870. In examples, the hardmask is formed using casting processes, chemical vapor deposition processes or physical vapor deposition techniques. Further, in examples, a resist is coated over the upper surface 872 of the hardmask and patterned using either lithography or spacer based pitch division techniques such as those described above. The dielectric layer and first hardmask are then etched using etching techniques previously described.

Figure 8B:
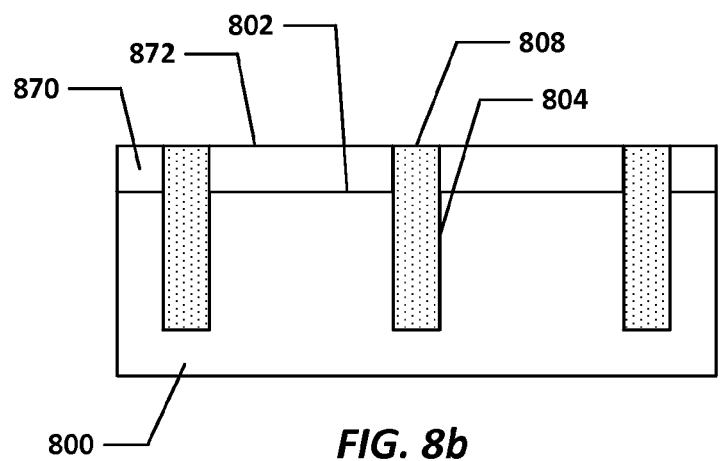
Figure 8C:
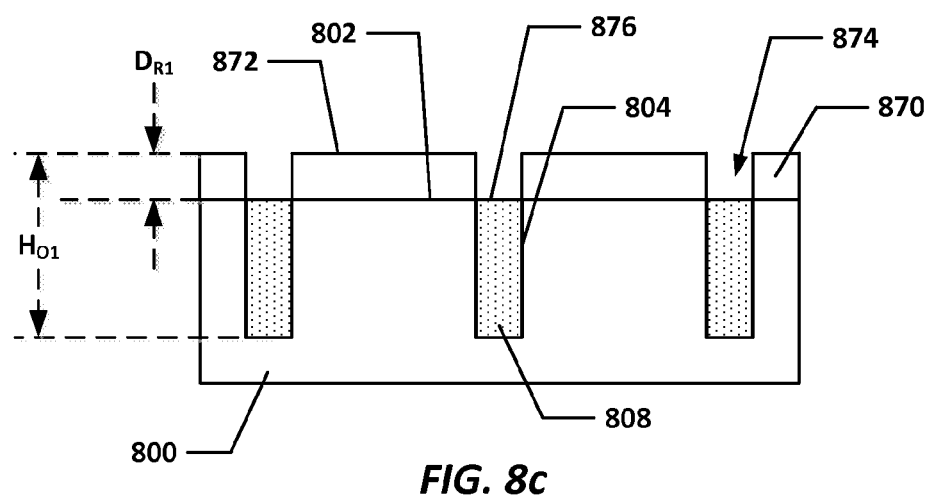
Figure 8D:
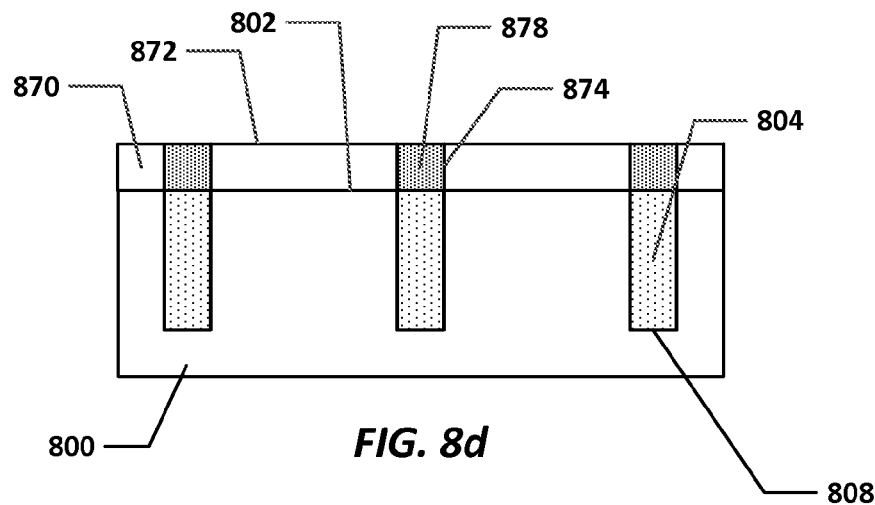

As illustrated in FIG. 8b, the first set of trenches 804 are filled with a first wire material forming wires of the first material 808 in the trenches 804. Again, in examples, the wires are formed using physical or chemical vapor deposition processes including those described above. The first set of wires 808 are then recessed from the upper surface of the hardmask 872. Recessing of the wires is accomplished, in embodiments, using etching techniques such as oxidative removal of the metal. FIG. 8c illustrates wires 808 recessed to form first recesses 874. The wires are recessed a distance $D_{R1}$ below the upper surface 872 of the first hardmask 870. In examples, distance $D_{R1}$ is in the range of 1% to 20% of the total height $H_{O1}$ of the opening 804, including all values and ranges therein, such as 5%, 10%, etc. In particular examples, the upper surface 876 of the wire 808 is level with the surface 802 of the dielectric layer 800. A second hardmask 878 is then deposited in the first set of recesses 874 and over the first wires 808 as illustrated in FIG. 8d. In embodiments, the upper surface of the second hardmask regions 878 are level with the first hardmask 870.

Figure 8E:
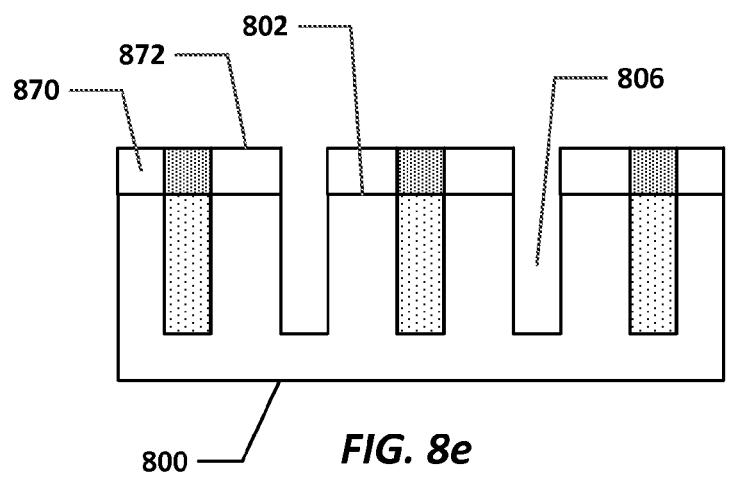
Figure 8F:
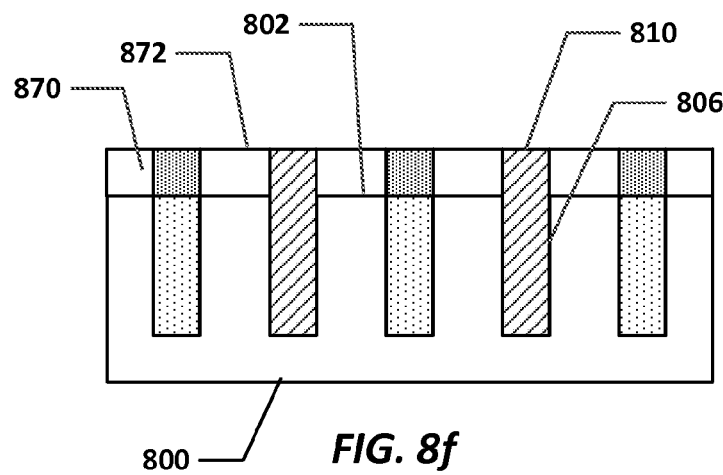
Figure 8G:
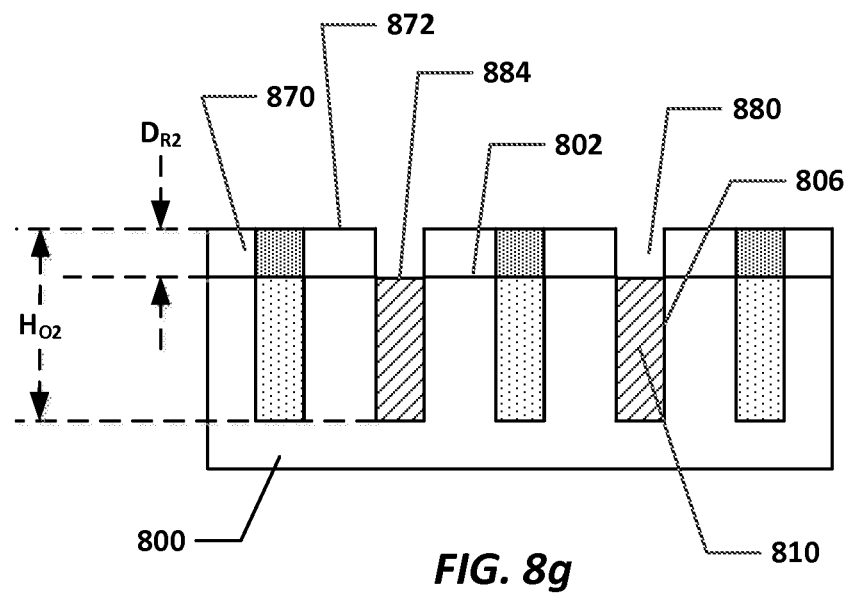
Figure 8H:
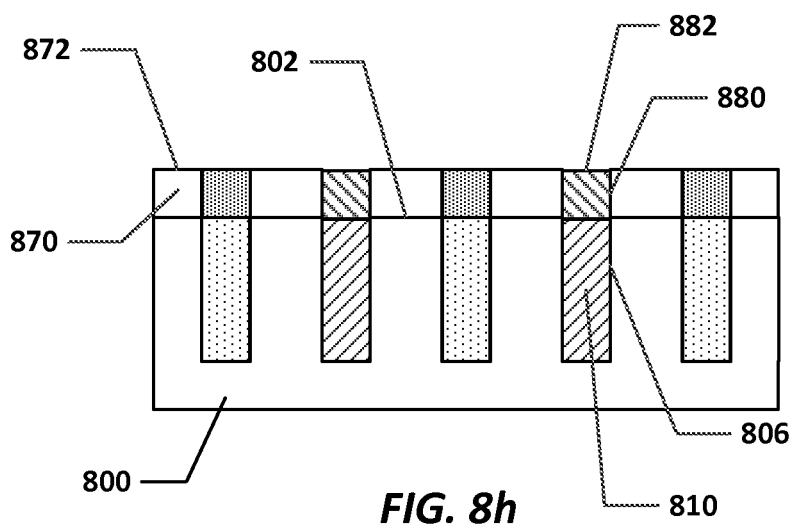

The second set of wires are then formed by forming a second set of trenches 806 in the first hardmask 870 and dielectric layer 800 using the patterning and etching techniques described above, as illustrated in FIG. 8e. The second wire material is then deposited in the trenches and any overburden is removed forming the second wires 810 illustrated in FIG. 8f. The wires 810 are then excised to below the upper surface 872 of the first hardmask 870 forming a second set of recesses 880 as illustrated in FIG. 8g. Again, an oxidative or other etching technique is used. As may be appreciated, given that the first metal wires are coated with the second hardmask, the first set of wires remains unaffected during the second wire recessing process. In examples, the wires are recessed a distance $D_{R2}$ is in the range of 1% to 20% of the total height $H_{O2}$ of the opening 806, including all values and ranges therein, such as 5%, 10%, etc. In particular examples, the upper surface 884 of the wire 808 is level with the surface 802 of the dielectric layer 800. A third hardmask 882 is then deposited in the recesses using the techniques described above as illustrated in FIG. 8h. In examples, the upper surfaces of the third hardmask 882 is level with the first hardmask 872.

Figure 9A:
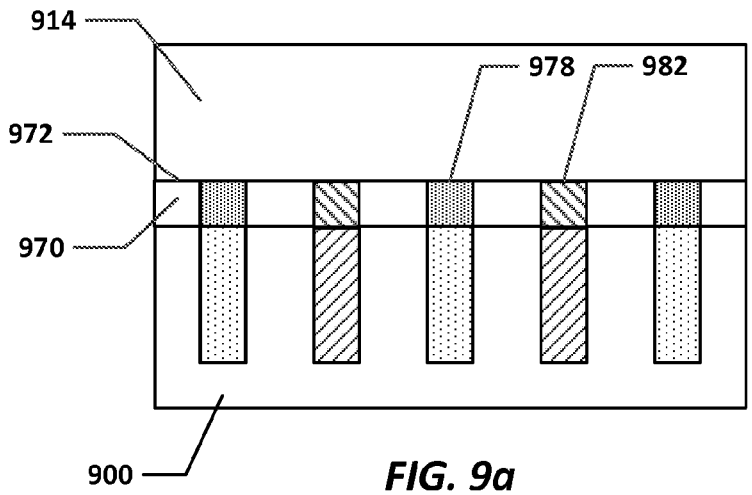

Turning to FIG. 9a, after the formation of the first dielectric layer, a second dielectric layer 914 is formed over the first dielectric layer 900 and hardmask layer including the first hardmask 970, the second hardmask 978, and third hardmask 982. The second dielectric layer is deposited over the first dielectric layer using a casting process or a vapor deposition process, including those described above.

Figure 9B:
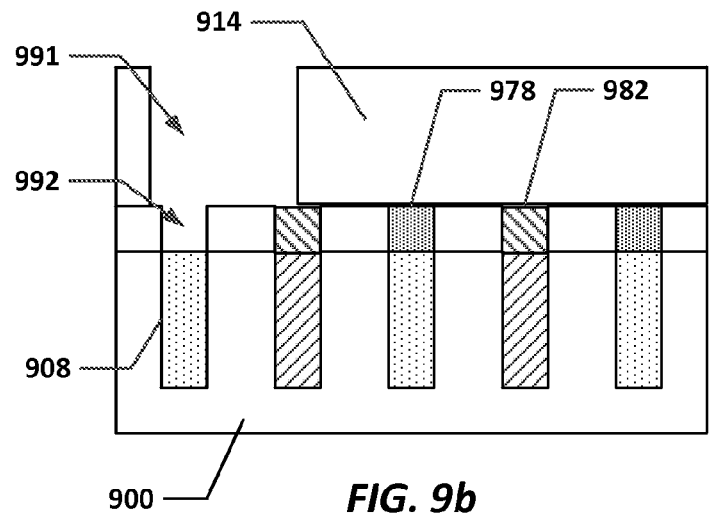
Figure 9C:
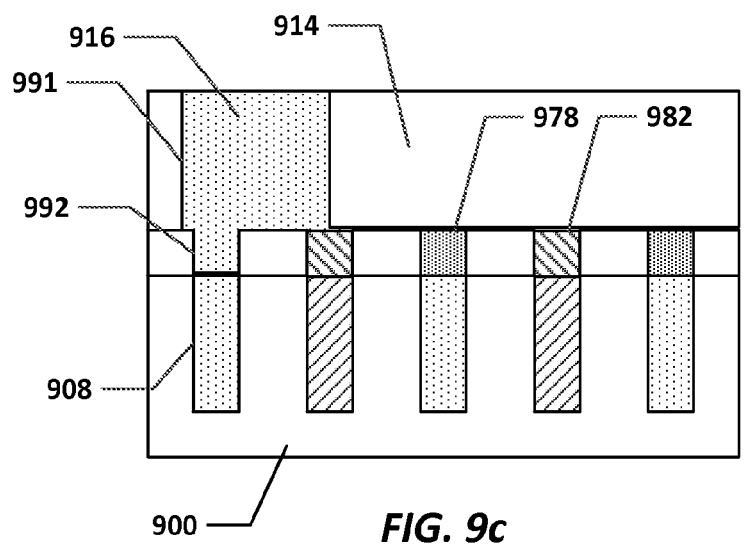

To provide connectivity to the wires in the first dielectric layer, vias are formed within the second dielectric layer by forming two openings, one in the second dielectric layer and one in the hardmask covering the wire to be connected to the via. As illustrated in FIG. 9b, a first via opening 991, extending through the second dielectric layer 914, is formed by patterning and etching, as previously described. If the via is to connect a wire formed of a first material 908, for example, the exposed portion of the second hardmask 978 is selectively removed to form a second via opening 992. The via material is then deposited into the first and second openings 991, 992 forming a via 916 as illustrated in FIG. 9c. In embodiments, the first via material is the same material as the material of the first wire 908 or exhibits similar bulk resistivity, electromigration properties or both. The via then contacts the first wire.

Figure 9D:
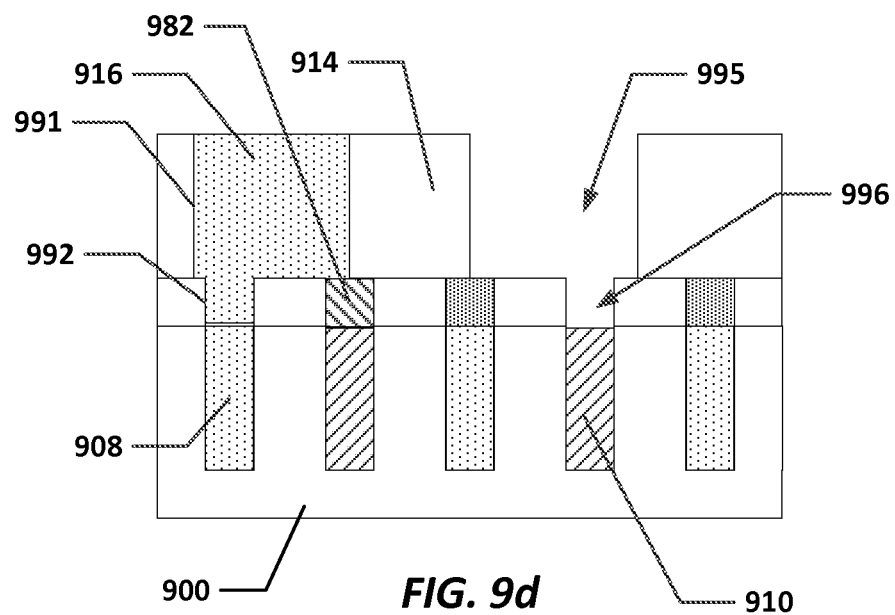
Figure 9E:
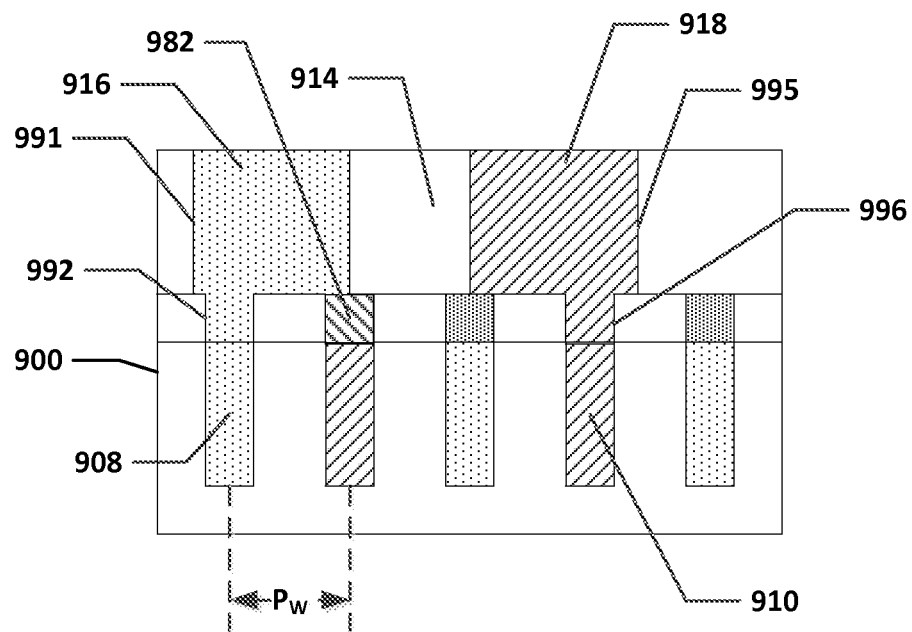

Similarly, if a via is to connect a wire formed of a second material 910, a first portion of the via is formed in the second dielectric layer and a second portion of the via is formed by removing the third hardmask 982 over the target wire. As illustrated in FIG. 9d, a first via opening 995, extending through the second dielectric layer 914, is formed by patterning and etching. A second via opening 996 is formed in the exposed portion of the third hardmask located above the wire 910 to be connected. Once the via openings are formed, the via material is then deposited into the first and second openings 995, 996, forming a via 918 as illustrated in FIG. 9e. In embodiments, the via material is the same material as the material of the second wire 910 or exhibits similar bulk resistivity, electromigration properties or both. The via then contacts the second wire.

Given that each of the hardmasks exhibit different etch selectivity from the other hardmasks, removal of the individual hardmask may be accomplished without affecting the other hardmasks, i.e., exposing the dielectric or wires underneath the other hardmasks. For example, when removing a portion of a second hardmask located over a given first wire, the first and third hardmasks remain intact, isolating the dielectric material and wires of second material proximal to the wire of first material that is of interest. When removing a portion of a third hardmask located over a given second wire, the first and second hardmasks remain intact, isolating the dielectric material and wires of first material proximal to the wire of second material that is of interest. In embodiments, the via openings have a width $W_O$ that is 1.5 times the pitch $P_W$ of the wire spacing $W_S$ (including first and second wires). Pitch may be understood as the distance between like features on adjacent wires, it is illustrates as center point to center point; however, it may also be from the left or right edge of each wire. This allows the overlay requirements to be relaxed when forming the first and second set of trenches. Furthermore, the via-metal shorting margin may be improved, which is understood to be the margin of error, or distance, between features provided to prevent shorting. In relaxing overlay and improving the via-metal shorting margin, the overall performance and reliability of the interconnects are improved.

While the above process for forming vias in a second dielectric layer to connect wires in a first dielectric layer is discussed in the context of litho-etch litho-etch pattern formation, a similar process may be performed when forming the interconnects using spacer based pitch division, as described above.

In embodiments, a dielectric layer includes one or more wires of a first material and a second material formed parallel to each other. In addition, one or more wires of first and second materials are optionally formed non-parallel to each other. Further, the first and second wires alternate across the surface of the dielectric layer (such as illustrated in FIG. 1); however, not all of the wires need to alternate across the surface in every embodiment.

In embodiments, one or more of the dielectric layers are provided in an integrated circuit. The wires and vias, when present, are used to connect various components associated with an integrated circuit. Components include, for example, transistors, diodes, power sources, resistors, capacitors, inductors, sensors, transceivers, receivers, antennas, etc. Components associated with an integrated circuit include those that are mounted on an integrated circuit or those connected to an integrated circuit. The integrated circuit is either analog or digital and may be used in a number of applications, such as microprocessors, optoelectronics, logic blocks, audio amplifiers, etc., depending on the components associated with the integrated circuit. The integrated circuit may be employed as part of a chipset for executing one or more related functions in a computer.

Reference to ordinal numbers herein, such as first and second, are for purposes of convenience and clarity to aid in the description. Furthermore, reference to "top", "bottom", "sides", etc. are provided for purposes of convenience and clarity to aid in description.

Accordingly, an aspect of the present disclosure relates to a method of depositing wires. The method includes forming a plurality of first trenches in a surface of a dielectric layer and forming a plurality of first wires, wherein each of the first wires are formed in each of the first trenches. Furthermore, the first wires are formed of a first material having a first bulk resistivity. The method also includes forming a plurality of second trenches in the surface of the dielectric layer and forming a plurality of second wires, wherein each of the second wires are formed in each of the second trenches. The second wires are formed of a second material having a second bulk resistivity. Further, the first bulk resistivity and second bulk resistivity are different.

In embodiments, the method further includes applying a first hardmask on the dielectric layer prior to forming the plurality of first trenches in the dielectric layer, wherein the plurality of first trenches is formed in the first hardmask as well as the dielectric layer. In addition, in any embodiment of the above, a portion of the first material is removed from each of the first wires, forming a first recess in each of the plurality of first trenches. Further, in embodiments of the above, a second hardmask is applied into the first recesses prior to forming the plurality of second trenches in the dielectric layer, wherein the second trenches also extend through the first hardmask. Also, in embodiments of the above, a portion of the second material is removed, forming a second recess in each of the plurality of second trenches; and applying a third hardmask into the second recesses.

In any of the embodiments of the above, the method also includes forming a second dielectric layer over the first dielectric layer, the first hardmask, the second hardmask, and the third hardmask. The method also includes forming a first via opening in the second dielectric layer and exposing a portion of the second hardmask. The method further includes removing the exposed portion of the second hardmask to form a second via opening. In addition, the first via opening and the second via opening are filled with the first material forming a via. Alternatively, or additionally, in any of the above embodiments, the method also includes forming a second dielectric layer over the first dielectric layer material, the first hardmask, the second hardmask, and the third hardmask. The method further includes forming a first via opening in the second dielectric layer and exposing a portion of the third hardmask and selectively removing the exposed portion of the third hardmask to form a second via opening. The method additionally includes filling the first via opening and the second via opening with the second material forming a via.

In any of the above embodiments, a barrier layer is optionally deposited in the plurality of second trenches prior to forming the second wires. Furthermore, in any of the above embodiments, the plurality of first trenches and the plurality of the second trenches are formed by litho-etch litho-etch of the dielectric layer. Alternatively, or in addition, in any of the above embodiments, the plurality of first trenches and the plurality of the second trenches are formed by spacer based pitch division.

In any of the above embodiments, the first wires are formed parallel to the second wires. In addition, in any of the above embodiments, the first material is deposited in the plurality of first trenches by vapor deposition. Furthermore, in any of the above embodiments, the second material is deposited in the second trench by vapor deposition. Also, in any of the above embodiments, the first bulk resistivity of the first material is 5.0 µΩ·cm or greater at 20° C., and preferably in the range of 5.0 to 8.0 µΩ·cm or greater at 20° C. Further, the second bulk resistivity of the second material is 4.0 µΩ·cm or less at 20° C., and preferably in the range of 1.0 to 4.0 µΩ·cm or greater at 20° C. Additionally, in any of the above embodiments, the dielectric layer exhibits a dielectric constant of less than 3.9 and preferably in the range of 1.5 to 3.8.

Another aspect of the present application is directed to an integrated circuit. In embodiments, the integrated circuit is formed using any one of the methods described above. The integrated circuit includes a first dielectric layer including a surface. A plurality of first trenches are defined in the dielectric layer surface. The integrated circuit also includes a plurality of first wires, wherein each of the first wires are formed in each of the first trenches. The first wires comprise a first material having a first bulk resistivity. The integrated circuit further includes a plurality of second trenches defined in the dielectric layer surface. Further, the integrated circuit includes a plurality of second wires, wherein each of the second wires are formed in each of the second trenches. The second wires comprise a second material having a second bulk resistivity. The first bulk resistivity and the second bulk resistivity are different.

In embodiments, the integrated circuit further comprises a hardmask layer comprising a first hardmask disposed over the first dielectric layer, a second markmask is disposed over the first material; and a third hardmask is disposed over the second material. In addition, the integrated circuit also includes, in embodiments, a second dielectric layer disposed over the hardmask layer; a first via opening in the second dielectric layer and a second via opening in the second hardmask layer adjoining the first via opening. A via is located in the first and second via openings formed from the first material, wherein the via contacts one of the first wires. Alternatively, or in addition to the above, the integrated circuit also includes a second dielectric layer disposed over the hardmask layer; a first via opening in the second dielectric layer and a via opening in the third hardmask layer adjoining the first via opening. A via is located in the first and second via openings formed from the second material, wherein the via contacts one of the second wires.

In any of the above embodiments, the plurality of first wires are parallel to the plurality of second wires. Furthermore, in any of the above embodiments, the plurality of first wires and the plurality of second wires alternate across the first dielectric layer surface. In addition, in any of the above embodiments, a barrier layer is deposited between each of the plurality of second trenches and the plurality of second wires. Also, in any of the above, embodiments, the first wires exhibit a first height and the second wires exhibit a second height and the first height is different from the second height.

Furthermore, in any of the above embodiments, the first bulk resistivity is 5.0 µΩ·cm or greater at 20° C., and preferably in the range of 5.0 to 8.0 µΩ·cm or greater at 20° C., and the second bulk resistivity is 4.0 µΩ·cm or less at 20° C., and preferably in the range of 1.0 to 4.0 µΩ·cm or greater at 20° C. In addition, in any of the above embodiments, the first dielectric layer exhibits a dielectric constant of less than 3.9 and preferably in the range of 1.5 to 3.8. Also, in any of the above embodiments, the second dielectric layer, when present, exhibits a dielectric constant of less than 3.9 and preferably in the range of 1.5 to 3.8.

Yet a further aspect of the present disclosure relates to an integrated circuit that includes a dielectric layer, a first set of wires formed within the dielectric layer and a second set of wires formed within the dielectric layer, the second set of wires comprising a second conductive material different than the first conductive material. The first set of wires comprises a first conductive material and the second set of wires comprises a second conductive material different than the first conductive material. In addition, the first set of wires alternates with the second set of wires such that each wire of the first set is only adjacent to wires of the second set, and wherein each wire of the second set is only adjacent to wires of the first set.

In embodiments of the above, the first conductive material has a lower resistance than the second conductive material. In addition, in any of the above, embodiments, the second conductive material exhibits lower electromigration than the first conductive material. Further, in embodiments of the above, the first set of wires comprises copper. In addition, in any of the above embodiments, the second set of wires comprises tungsten. Furthermore, in any of the above embodiments, hardmasks are formed atop the first set of wires. In addition, in any of the above embodiments, hardmasks are formed atop the second set of wires.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method of depositing wires, comprising:
    forming a plurality of first trenches in a surface of a dielectric layer;
    forming a plurality of first wires, wherein each of said first wires are formed in each of said first trenches and said first wires are formed of a first material having a first bulk resistivity;
    forming a plurality of second trenches in said surface of said dielectric layer; and
    forming a plurality of second wires, wherein each of said second wires are formed in each of said second trenches and said second wires are formed of a second material having a second bulk resistivity, wherein said first bulk resistivity and second bulk resistivity are different;
    wherein the method further comprises:
    applying a first hardmask on said dielectric layer prior to forming said plurality of first trenches in said dielectric layer and said plurality of first trenches is formed in said first hardmask and said dielectric layer;
    removing a portion of said first material from each of said first wires, forming a first recess in each of said plurality of first trenches; and
    applying a second hardmask into said first recesses prior to forming said plurality of second trenches in said dielectric layer, wherein said second trenches extend through said first hardmask.

2. The method of claim 1, further comprising removing a portion of said second material, forming a second recess in each of said plurality of second trenches; and applying a third hardmask into said second recesses.

3. The method of claim 2, further comprising forming a second dielectric layer over said first dielectric layer, said first hardmask, said second hardmask, and said third hardmask; forming a first via opening in said second dielectric layer and exposing a portion of said second hardmask; removing said exposed portion of said second hardmask to form a second via opening; and filling said first via opening and said second via opening with said first material forming a via.

4. The method of claim 2, further comprising forming a second dielectric layer over said first dielectric layer material, said first hardmask, said second hardmask, and said third hardmask; forming a first via opening in said second dielectric layer and exposing a portion of said third hardmask; selectively removing said exposed portion of said third hardmask to form a second via opening; and filling said first via opening and said second via opening with said second material forming a via.

5. The method of claim 1, wherein said plurality of first trenches and said plurality of said second trenches are formed by lithography of said dielectric layer.

6. The method of claim 1, wherein said plurality of first trenches and said plurality of said second trenches are formed by spacer based pitch division.

7. The method of claim 1, wherein said first bulk resistivity is 5.0 $\mu\Omega\cdot$cm or greater at 20° C.

8. The method of claim 1, wherein said second second bulk resistivity is 4.0 $\mu\Omega\cdot$cm or less at 20° C.

9. The method of claim 1, wherein said dielectric layer exhibits a dielectric constant of less than 3.9.

10. An integrated circuit, comprising:
    a first dielectric layer including a surface;
    a plurality of first trenches defined in said dielectric layer surface;
    a plurality of first wires, wherein each of said first wires are formed in each of said first trenches, wherein said first wires comprise a first material having a first bulk resistivity;
    a plurality of second trenches defined in said dielectric layer surface; and
    a plurality of second wires;
    wherein:
    each of said second wires are formed in each of said second trenches;
    said second wires comprise a second material having a second bulk resistivity;
    said first bulk resistivity and said second bulk resistivity are different; and
    the integrated circuit further comprises a hardmask layer comprising a first hardmask disposed over said first dielectric layer and a second hardmask disposed over said first material.

11. The integrated circuit of claim 10, wherein said hardmask layer further comprises a third hardmask disposed over said second material.

12. The integrated circuit of claim 11, further comprising a second dielectric layer disposed over said hardmask layer; a first via opening in said second dielectric layer and a second via opening in said second hardmask layer adjoining said first via opening; and a via located in said first and second via openings formed from said first material, wherein said via contacts one of said first wires.

13. The integrated circuit of claim 11, further comprising a second dielectric layer disposed over said hardmask layer; a first via opening in said second dielectric layer and a second via opening in said third hardmask layer adjoining said first via opening; and a via located in said first and second via openings formed from said second material, wherein said via contacts one of said second wires.

14. The integrated circuit of claim 10, wherein said first wires exhibit a first height and said second wires exhibit a second height and said first height is different from said second height.

15. The integrated circuit of claim 10, wherein said first bulk resistivity is 5.0 $\mu\Omega\cdot$cm or greater at 20° C.

16. The integrated circuit of claim 10, wherein said second bulk resistivity is 4.0 $\mu\Omega\cdot$cm or less at 20° C.

17. The integrated circuit of claim 10, wherein said first dielectric layer exhibits a dielectric constant of less than 3.9.

18. The integrated circuit of claim 12, wherein said second dielectric layer exhibits a dielectric constant of less than 3.9.

19. An integrated circuit comprising:
    a dielectric layer;
    a first set of wires formed within the dielectric layer, the first set of wires comprising a first conductive material; and a second set of wires formed within the dielectric layer, the second set of wires comprising a second conductive material different than the first conductive material;

wherein:

the first set of wires alternates with the second set of wires such that each wire of the first set is only adjacent to wires of the second set, and wherein each wire of the second set is only adjacent to wires of the first set; and the integrated circuit further comprises a first hardmask disposed over the first conductive material of said first set of wires.

20. The integrated circuit of claim 19, wherein the first set of wires comprises copper.

21. The integrated circuit of claim 20, wherein the second set of wires comprises tungsten.

22. The integrated circuit of claim 19, wherein the first conductive material has a lower resistance than the second conductive material.

23. The integrated circuit of claim 19, wherein the second conductive material exhibits lower electromigration than the first conductive material.

24. The integrated circuit of claim 19, further comprising a second hardmask disposed over the second conductive material of said second set of wires.

25. A method of depositing wires, comprising:

forming a plurality of first trenches in a surface of a dielectric layer;

forming a plurality of first wires, wherein each of said first wires are formed in each of said first trenches and said first wires are formed of a first material having a first bulk resistivity;

forming a plurality of second trenches in said surface of said dielectric layer; and forming a plurality of second wires, wherein each of said second wires are formed in each of said second trenches and said second wires are formed of a second material having a second bulk resistivity;

wherein:

said first bulk resistivity and second bulk resistivity are different; and the plurality of first trenches and the plurality of second trenches are formed by spacer based pitch division.

26. An integrated circuit, comprising:

a first dielectric layer including a surface;

a plurality of first trenches defined in said dielectric layer surface;

a plurality of first wires, wherein each of said first wires are formed in each of said first trenches, wherein said first wires comprise a first material having a first bulk resistivity;

a plurality of second trenches defined in said dielectric layer surface; and a plurality of second wires;

wherein:

each of said second wires are formed in each of said second trenches;

said second wires comprise a second material having a second bulk resistivity;

said first bulk resistivity and said second bulk resistivity are different; and said first wires exhibit a first height and said second wires exhibit a second height that is different from said second height.

* * * * *